US006501659B1

(12) United States Patent
Bodensteiner et al.

(10) Patent No.: US 6,501,659 B1
(45) Date of Patent: Dec. 31, 2002

(54) METHOD AND SYSTEM FOR IDENTIFYING AN INDUSTRIAL PERSONAL COMPUTER IN A RACK

(75) Inventors: John R. Bodensteiner; Craig J. Jensen, both of Cedar Rapids, IA (US)

(73) Assignee: Crystal Group Inc., Hiawatha, IA (US)

( * ) Notice: Subject to any disclaimer, the term of this patent is extended or adjusted under 35 U.S.C. 154(b) by 149 days.

(21) Appl. No.: 09/589,418

(22) Filed: Jun. 7, 2000

(51) Int. Cl.[7] .............................. H05K 7/10; H05K 5/02
(52) U.S. Cl. ...................... 361/732; 361/733; 361/731; 361/729; 361/728; 312/223.2
(58) Field of Search .................... 361/724, 732, 361/786, 679, 683, 725, 727, 728, 729, 730, 733, 741, 747; 312/223.1–223.3

(56) References Cited

U.S. PATENT DOCUMENTS

| | | | | |
|---|---|---|---|---|
| 3,375,408 A | * | 3/1968 | Buhrendorf et al. | 361/796 |
| 4,053,724 A | * | 10/1977 | Llona | 200/51 R |
| 4,546,414 A | * | 10/1985 | Donges | 361/413 |
| 4,598,336 A | * | 7/1986 | Hehl | 361/391 |
| 4,755,149 A | * | 7/1988 | de Jong et al. | 439/248 |
| 4,800,462 A | * | 1/1989 | Zacher et al. | 361/413 |
| 5,019,947 A | * | 5/1991 | Pelzl | 361/415 |
| 5,128,830 A | * | 7/1992 | Deluca et al. | 361/383 |
| 5,234,348 A | * | 8/1993 | Konsevich et al. | 439/61 |
| 6,025,989 A | * | 2/2000 | Ayd et al. | 361/695 |
| 6,175,490 B1 | * | 1/2001 | Papa et al. | 361/686 |
| 6,259,605 B1 | * | 7/2001 | Schmitt | 361/727 |
| 6,279,755 B1 | * | 8/2001 | Bodensteiner et al. | 211/26 |

FOREIGN PATENT DOCUMENTS

EP 0443492 A1 * 8/1991

* cited by examiner

Primary Examiner—Anatoly Vortman
(74) Attorney, Agent, or Firm—Simmons, Perrine, Albright & Ellwood, PLC

(57) ABSTRACT

A system and method for identifying a match between an industrial PC to a slot in a rack which uses a blind mating keying and locking plates, so that when the mechanical keying plate and locking plate do match, then full insertion of the PC into the slot is permitted. When a mis-match occurs, then full insertion is prohibited.

11 Claims, 2 Drawing Sheets

METHOD AND SYSTEM FOR IDENTIFYING AN INDUSTRIAL PERSONAL COMPUTER IN A RACK

FIELD OF THE INVENTION

The present invention generally relates to computers, and more particularly relates to personal computers, and even more particularly relates to methods and systems for identifying personal computers with racks.

BACKGROUND OF THE INVENTION

In recent years, industrial personal computers have become increasingly prevalent in many industries. It is not uncommon today to see rows of industrial PCs arranged in racks. These racks may be populated with a single type, model, or brand of computer or an assortment of brands, models, and types. For example, some racks may contain computers which are dedicated to particular tasks; e.g., email, firewalls, web page hosting, etc. While many of these industrial PCs are often designed and manufactured to higher standards than consumer PCs, they still are occasionally in need of repair. When this happens, the PC is usually required to be removed from the rack to enable service to occur. At times, several of the computers in a rack may be removed, or slots in the rack might otherwise be unoccupied. One approach that has been used in the past to identify PCs to particular slots is to use labels or other textual tags, etc. on the PC and the appropriate slots.

While these labels and/or tags have been used extensively in the past, they do have some drawbacks. First of all, they require that the person installing the PCs into a slot be familiar with the labeling scheme. Secondly, they require that the scheme be correctly implemented. At times, due to lack of attention, knowledge, or other reasons, a PC is inserted into an improper slot. This can result in damage to the PC, a failure to operate, or even worse.

Also, in the past single computers have had individual circuit cards which have blind mating identification mechanisms thereon to prohibit improper insertion of these circuits cards into the single computer. However, they were not entire PCs inserted into rack.

Consequently, there exists a need for improved methods and systems for identifying PCs within a rack of PCs.

SUMMARY OF THE INVENTION

It is an object of the present invention to provide a system and method for identifying a PC within a rack in an efficient manner.

It is a feature of the present invention to utilize a mechanical keying system.

It is another feature of the present invention to include a blind mating keying system.

It is an advantage of the present invention to achieve certainty that a PC installed in a rack slot is the appropriate PC in the appropriate slot.

It is another advantage of the present invention to reduce the occurrences of human error which result in improper PC placement.

It is another advantage of the present invention to use a simple single motion to both identify and install a PC into the proper slot.

The present invention is an apparatus and method for identifying industrial personal computers within a rack. The invention is designed to satisfy the aforementioned needs, provide the previously stated objects, include the above-listed features, and achieve the already articulated advantages. The present invention is carried out in a "human error-less" manner in a sense that the human error associated with implementing a labeling scheme has been greatly reduced.

Accordingly, the present invention is a system and method including a configurable mechanical keying plate disposed on an exterior of an industrial computer with a corresponding locking plate disposed within a slot in a rack of PCs.

BRIEF DESCRIPTION OF THE DRAWINGS

The invention may be more fully understood by reading the following description of the preferred embodiments of the invention, in conjunction with the appended drawings wherein.

DETAILED DESCRIPTION

Figure 1:
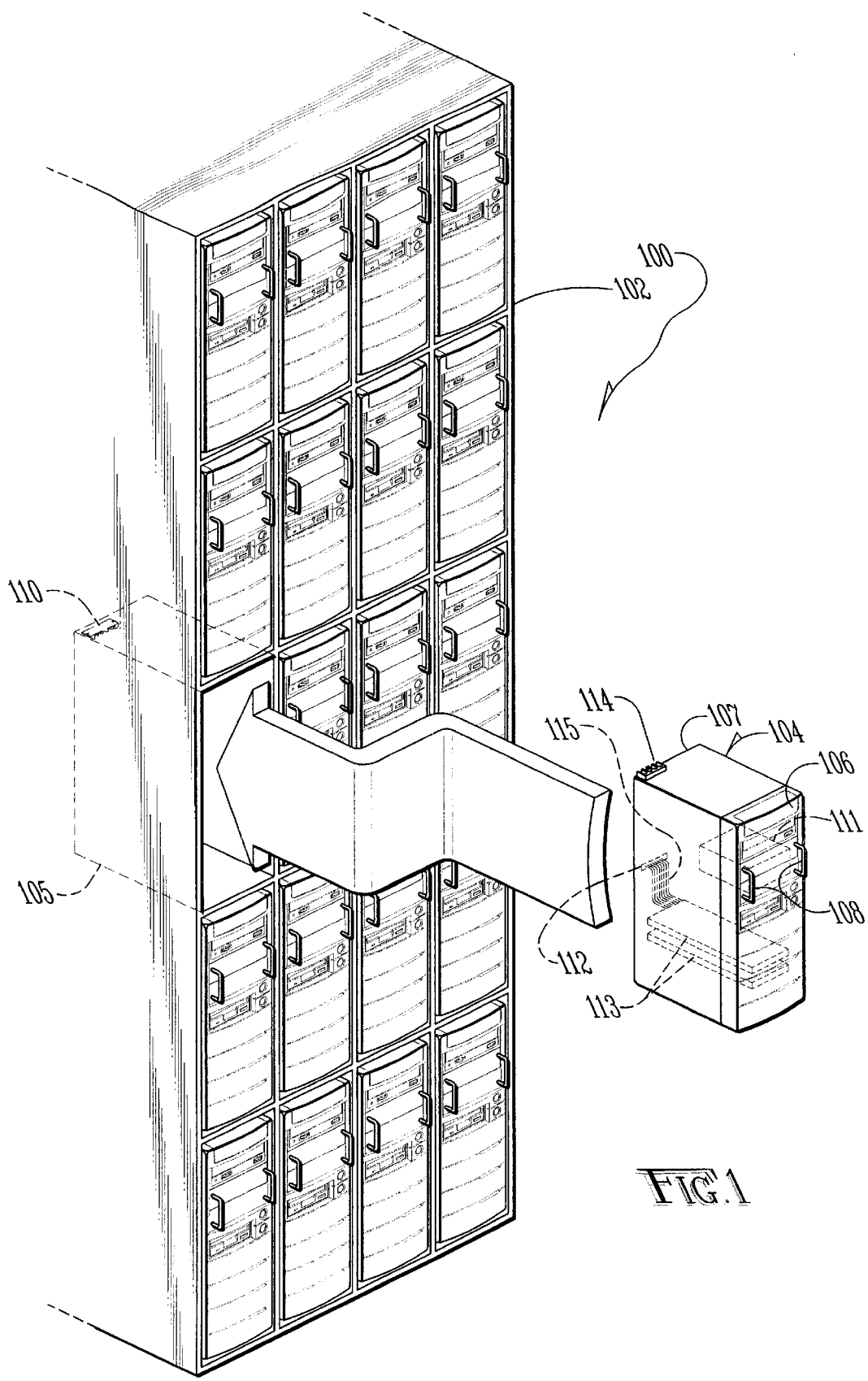
FIG. 1 is an exploded perspective view of a system of the present invention.

Now referring to the drawings wherein like numerals refer to like matter throughout, and more specifically referring to FIG. 1, there is shown a system of the present invention generally designated 100, including a rack 102 for retaining industrial PCs. An industrial PC 104 is shown having been removed from a slot 105 in rack 102. PC 104 has a front end 106 and a rear end 107. PC 104 preferably is a general purpose PC having a CPU 111 and a plurality of expansion cards 113 disposed therein and coupled to the CPU 111 via an internal buss 115. Front end 106 has a handle 108 thereon. Also shown in FIG. 1 is keying plate 110 and a quick connecting blind mating connector 112. Keying plate 110 will mate with latching plate 114 when PC 104 is placed within slot 105.

Figure 2:
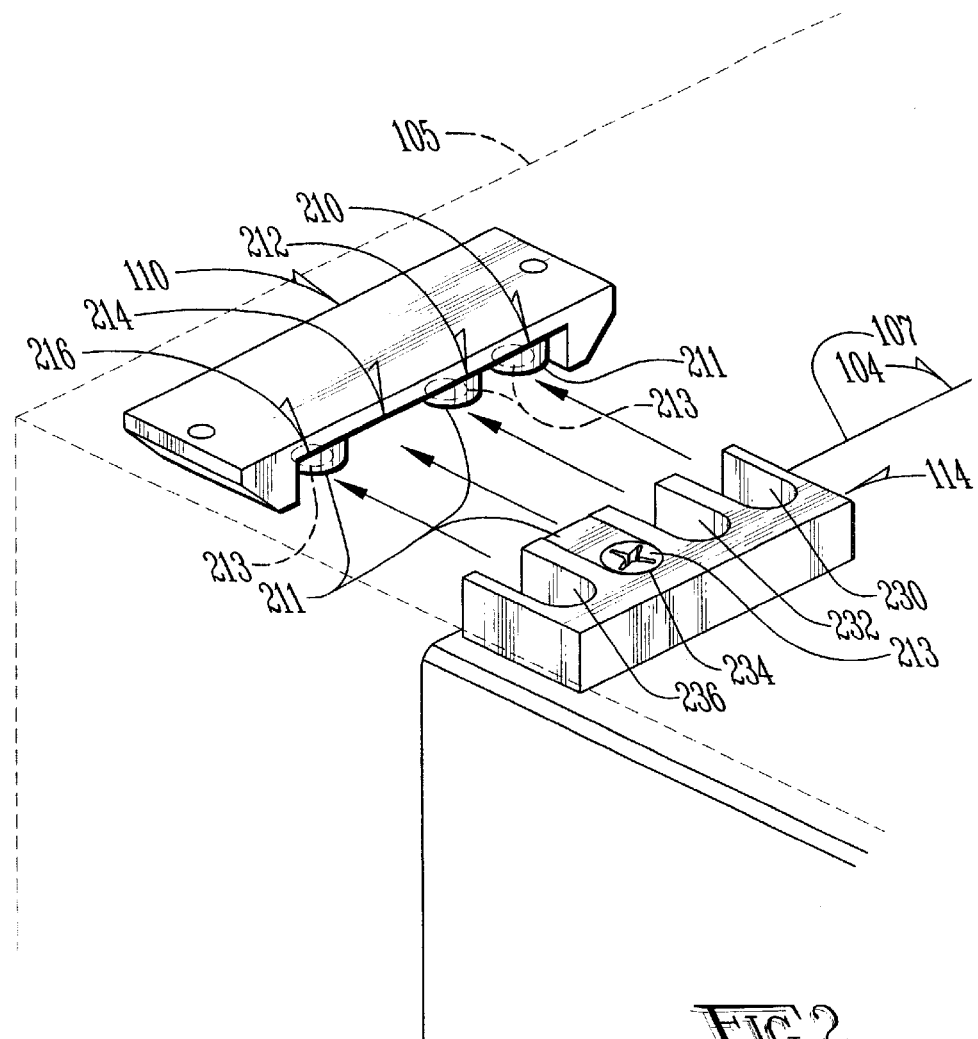
FIG. 2 is an exploded enlarged perspective view of un-mated keying plate/locking plate portion of a system of FIG. 1.

Now referring to FIG. 2, there is shown an exploded view of the keying plate and locking plate portion of the system of FIG. 1. There is shown keying plate 110, which is coupled to the PC 104 (FIG. 1) and locking plate 114, which is coupled to the rack 102 (FIG. 1). Disposed on keying plate 110 are keying slots 210, 212, 214, and 216. Slots 210, 212, and 216 are shown having keying inserts 211 disposed therein. These keying inserts 211 may be any type of device which occupies space in and prevents reception of a keying pin into the slots 210, 212, 214, and 216. In a preferred embodiment, the keying insert 211 may have a protuberance raised region 213 or a pin disposed thereon. Preferably when the slot is unoccupied by a keying insert, it is capable of receiving a locking pin therein. Also shown in FIG. 2 is a locking plate 114 containing locking slots 230, 232, 234, and 236. Locking slots 230, 232, and 236 are shown as unoccupied; i.e., not having a locking pin insert disposed therein. Locking slot 234 is shown as occupied with a locking pin insert. Preferably both keying inserts and locking pin inserts are removable slide or snap inserts; however, any means of coupling these inserts to the plates is intended to be covered within the scope of the claims.

In operation, keying plate 110 and locking plate 114 are shown in FIG. 2 to be uniquely configured so as to permit mating. Unoccupied slot 214 permits reception of the locking pin disposed in slot 234. Likewise, the fact that slots 230, 232, and 236 are unoccupied permits reception of the keying pins on the keying inserts disposed in slots 210, 212 and 216, respectively. For example, if locking plate 114 were configured for another PC, it might have an additional locking pin in slot 232. If this were the case, the keying insert in slot 212 would prohibit the reception of the locking pin in slot 232, and thereby prohibit the mating of keying plate 110 with the locking plate 114. The number, shape orientation, and placement of slots in the locking and key plates may differ from the 4 slots shown. In a preferred embodiment, a repair technician may employ a master-keyed PC, which would be accepted into any slot, irrespective of the particular locking plate associated with that slot. This master-keyed PC may be as simple as a PC with all slots 210, 212, 214, and 216 being unoccupied.

It is contemplated that numerous alternate approaches could be used, all of which are intended to be included within the scope of the claims. For example, any variation of blind matable connectors could be used which have the ability to identify a PC and a slot and to permit rejection of the PC if it were not the proper PC for the slot. Preferably, the plates 110 and 114 are mounted and configured so that a failure to mate will result in an inability to connect any blind-matable electrical connectors on the PC and in the slot. One method of controlling the mating of electrical blind-mating connectors is to have the slots be sufficiently long so that the difference in permissible travel of the PC within the slot is significantly longer when the IDs match and insertion is permitted.

Throughout this description, reference is made to an industrial PC because it is believed that the beneficial aspects of the present invention would be most readily apparent when used in connection with industrial PCs. However, it should be understood that the present invention is not intended to be limited to industrial PCs, and should be hereby construed to include other non-industrial PCs.

Throughout this description, the term "industrial PC" is used to represent a general purpose PC of the type which is capable of being stored in racks of multiple rows of PCs where each row has multiple PCs, and where the PCs are coupled to wiring associated with the rack and other equipment by at least one connector at the rear end of the PC. This definition of industrial PCs is not intended to include laptop PCs which have connectors on the rear end of the laptop for coupling with a docking station or a port replicator. Consequently, the term "industrial PC" will specifically exclude any computer which has along its top side a hinged display screen hinged along the rear end of the PC.

It is thought that the method and apparatus of the present invention will be understood from the foregoing description and that it will be apparent that various changes may be made in the form, construct steps, and arrangement of the parts and steps thereof, without departing from the spirit and scope of the invention or sacrificing all of their material advantages. The form herein described is merely a preferred exemplary embodiment thereof.

We claim:

1. An industrial PC system comprising:
    a rack having a plurality of slots therein for receiving industrial PCs;
    a first one of said plurality of slots having a slot identification device disposed therein;
    a first PC, which has predetermined characteristics suitable for use in said first one of said plurality of slots, said first PC having a PC identification device coupled thereto;
    said slot identification device and said PC identification device cooperate to selectively prohibit full insertion of a PC into said first one of said plurality of slots when predetermined characteristics of said first one and said first PC do not match;
    wherein said first PC includes a blind mating connector disposed at a rear end of the first PC for mating with a blind mating connector disposed at a distal end of an entrance opening of said first one;
    wherein a single horizontal motion of the first PC will, when predetermined characteristics of said slot identification device and said PC identification device have a predetermined relationship, result in both identification and electrical coupling of the first PC with the rack;
    wherein said first PC is a general purpose PC having a CPU and a plurality of expansion cards disposed therein and coupled to the CPU via an internal buss;
    wherein said first PC is housed in a rectangular shaped box case; and
    wherein said first PC has a retractable handle thereon; the handle, when pulled, enables the PC to be removed from the rack.

2. A system of claim 1 wherein the PC identification device is a first plate having a first plurality of elongated voids therein, wherein the first plurality of elongated voids have disposed therein removable inserts.

3. A system of claim 2 wherein the removable inserts have raised protuberances thereon.

4. A system of claim 3 wherein the slot identification device is a second plate having a second plurality of elongated voids therein, wherein the second plurality of elongated voids has disposed therein removable inserts having protuberances thereon.

5. A system of claim 4 wherein insertion of the PC into the rack is prohibited when a first predetermined elongated void of said first plurality of elongated voids has an insert therein with a protuberance thereon which collides with a protuberance on an insert in a second predetermined elongated void in said second plurality of elongated voids.

6. A system of claim 4 wherein said PC is a master-keyed PC having no inserts in any of the first plurality of elongated voids, so that said master-keyed PC may be fully inserted into any slot having a slot identification device therein, irrespective of any configuration of removable inserts therein.

7. A system of claim 4 wherein said first plurality of elongated voids each have an elongated void length dimension running parallel with a length dimension of said PC and a length dimension of said slot.

8. A system of claim 7 wherein said elongated void length dimension is variable, depending upon whether a removable insert is disposed in an elongated void;
    said elongated void length dimension is a full length dimension when no removable insert is located in a void;
    said elongated void length is a truncated length dimension when an insert is located in a void; and,
    a difference in length dimension between said full length and said truncated length being larger than a predetermined distance such that electrical connection between the PC and the slot is accomplished upon PC insertion into the slot when an opposing protuberance is permitted to move, in an elongated void, a distance greater than the truncated length and an electrical connection between the PC and the slot is prohibited when an opposing protuberance is precluded from moving a distance in an elongated void which is greater than said truncated length.

9. A system of controlling insertion of PCs into an industrial PC rack comprising:

means for identifying a particular PC;

means for identifying a particular slot in a rack of PCs;

wherein said means for identifying a particular PC is a mechanical mating member deployed on an outside surface of a PC;

wherein said means for identifying a particular slot is a mechanical mating member deployed on an inside portion of said particular slot;

said system further comprising a structure which aligns features of said means for identifying a particular PC with said means for identifying a particular slot; and wherein said means for identifying a particular PC includes a plate disposed on an outside surface of said particular PC, said plate having a plurality of elongated holes, with a plurality of removable inserts having protuberances thereon disposed in said holes, whereby insertion of a particular PC into a particular slot is controlled based upon an interaction between said means for identifying a particular PC and said means for identifying a particular slot in a rack.

10. A system comprising:

a rack having a plurality of slots therein for receiving industrial PCs;

a first one of said plurality of slots having a slot identification device disposed therein;

a first PC, which has predetermined characteristics suitable for use in said first one of said plurality of slots, said first PC having a PC identification device coupled thereto, said slot identification device and said PC identification device cooperate to selectively prohibit full insertion of a PC into said first one of said plurality of slots when predetermined characteristics of said first one and said first PC do not match;

said first PC includes a blind mating connector disposed at a rear end of the first PC for mating with a blind mating connector disposed at a distal end of an entrance opening of said first one;

wherein a single horizontal motion of the first PC will, when predetermined characteristics of said slot identification device and said PC identification device have a predetermined relationship, result in both identification and electrical coupling of the first PC with the rack;

said first PC is a general purpose PC having a CPU and a plurality of expansion cards disposed therein and coupled to the CPU via an internal buss;

said first PC is housed in a rectangular shaped box case;

the PC identification device is a first plate having a first plurality of elongated voids therein, wherein the first plurality of elongated voids have disposed therein removable inserts;

the removable inserts have raised protuberances thereon;

the slot identification device is a second plate having a second plurality of elongated voids therein, wherein the second plurality of elongated voids has disposed therein removable inserts having protuberances thereon;

said first plurality of elongated voids each have an elongated void length dimension running parallel with a length dimension of said rectangular shaped box case and a length dimension of said slot;

said elongated void length dimension is variable, depending upon whether a removable insert is disposed in an elongated void;

said elongated void length dimension is a full length dimension when no removable insert is located in a void;

said elongated void length is a truncated length dimension when a removable insert is located in a void;

a difference in length dimension between said full length and said truncated length being larger than a predetermined distance such that electrical connection between the PC and the slot is accomplished upon PC insertion into the slot when an opposing protuberance is permitted to move, in an elongated void, a distance greater than the truncated length; and, an electrical connection between the PC and the slot is prohibited when an opposing protuberance is precluded from moving a distance in an elongated void which is greater than said truncated length.

11. A system of claim 10 wherein said removable inserts are coupled with said elongated void by insertion into the elongated void in a direction orthogonal to a direction of the full length dimension.

* * * * *